(12) United States Patent
Zeeshan et al.

(10) Patent No.: US 11,459,652 B2
(45) Date of Patent: Oct. 4, 2022

(54) TECHNIQUES AND DEVICE STRUCTURES BASED UPON DIRECTIONAL DIELECTRIC DEPOSITION AND BOTTOM-UP FILL

(71) Applicant: Applied Materials, Inc., Santa Clara, CA (US)

(72) Inventors: M. Arif Zeeshan, Manchester-by-the-sea, MA (US); Tristan Y. Ma, Lexington, MA (US); Kelvin Chan, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 161 days.

(21) Appl. No.: 17/072,143

(22) Filed: Oct. 16, 2020

(65) Prior Publication Data
US 2022/0119938 A1 Apr. 21, 2022

(51) Int. Cl.
*H01L 21/02* (2006.01)
*C23C 16/02* (2006.01)
*H01L 21/285* (2006.01)
*C23C 16/505* (2006.01)
*H01J 37/32* (2006.01)
(Continued)

(52) U.S. Cl.
CPC ........ *C23C 16/0272* (2013.01); *C23C 16/505* (2013.01); *H01L 21/02274* (2013.01); *H01L 21/28562* (2013.01); *H01J 37/32082* (2013.01); *H01J 2237/3321* (2013.01); *H01L 21/2885* (2013.01); *H01L 21/28568* (2013.01); *H01L 27/10844* (2013.01)

(58) Field of Classification Search
None
See application file for complete search history.

(56) References Cited

U.S. PATENT DOCUMENTS 5,290,358 A * 3/1994 Rubloff ................. C23C 16/455
118/725
9,837,312 B1 * 12/2017 Tan ..................... C23C 18/1632
10,529,622 B1 * 1/2020 Maniscalco ....... H01L 21/76858
(Continued)

OTHER PUBLICATIONS

Talukdar et al., "Seamless fill of deep trenches by chemical vapor deposition: Use of a molecular growth inhibitor to eliminate pinch-off," JVST, 2019, 11 pages.
(Continued)

*Primary Examiner* — Asok K Sarkar
(74) *Attorney, Agent, or Firm* — KDB Firm PLLC

(57) ABSTRACT

Embodiments herein include void-free material depositions on a substrate (e.g., in a void-free trench-filled (VFTF) component). In some embodiments, a method may include providing a plurality of device structures extending from a base, each of the plurality of device structures including a first sidewall opposite a second sidewall and a top surface extending between the first and second sidewalls, and providing a seed layer over the plurality of device structures. The method may further include forming a dielectric layer along just the top surface and along an upper portion of the first and second sidewalls using an angled deposition delivered to the plurality of device structures at a non-zero angle of inclination relative to a perpendicular extending from an upper surface of the base, and forming a fill material within one or more trenches defined by the plurality of device structures.

20 Claims, 8 Drawing Sheets

(51) Int. Cl.
*H01L 21/288* (2006.01)
*H01L 27/108* (2006.01)

(56) References Cited

U.S. PATENT DOCUMENTS

| | | | | |
|---|---|---|---|---|
| 2011/0266676 | A1* | 11/2011 | Isobayashi | H01L 21/76867 257/E23.141 |
| 2018/0061628 | A1* | 3/2018 | Ou | H01L 21/32 |
| 2020/0111660 | A1* | 4/2020 | Park | H01L 21/76843 |
| 2021/0143004 | A1* | 5/2021 | Kumagai | H01L 22/26 |
| 2022/0108915 | A1* | 4/2022 | Liu | H01J 37/32449 |

OTHER PUBLICATIONS https://nikonereview.com/2017/tokyo-electron-expert-presents-exciting-view-of-patterning-in-sub-5-nm-era/, 7 pages.

* cited by examiner

TECHNIQUES AND DEVICE STRUCTURES BASED UPON DIRECTIONAL DIELECTRIC DEPOSITION AND BOTTOM-UP FILL

FIELD OF THE DISCLOSURE

The present embodiments relate to semiconductor device structures, and more particularly, to techniques and device structures based upon directional dielectric deposition and bottom-up fill.

BACKGROUND OF THE DISCLOSURE

Semiconductor devices are manufactured as single discrete devices and as integrated circuits, which include two or more devices, which can number from the hundreds to the billions, manufactured and interconnected on a single substrate (e.g., a semiconductor wafer). Semiconductor devices are manufactured with exacting standards and precision techniques such as void-free material depositions (VFMDs). One of the techniques for VFMDs includes forming trenches in a substrate that are later filled with another material, such as metal.

Oftentimes the trenches are filled using a chemical vapor deposition (CVD) process. Despite meticulous control over deposition conditions in early-node and current-node devices, traditional CVD approaches suffer from seams and voids due to overhang pinch-off and "bread-load" effects. Filling trenches with a material while preventing voids from forming has traditionally been a time-consuming and complex process, which adds considerable costs to devices fabricated using the process. For example, forming void-free trench fills has traditionally required surface treatments that complicate process flows and/or require pre-existing metal at the bottom of the trench.

Accordingly, improved approaches are needed for void-free material depositions, such as for the manufacture of semiconductor devices.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In some embodiments, a method may include providing a plurality of device structures extending from a base, each of the plurality of device structures including a first sidewall opposite a second sidewall and a top surface extending between the first and second sidewalls, and providing a seed layer over the plurality of device structures. The method may further include forming a dielectric layer along just the top surface and along an upper portion of the first and second sidewalls using an angled deposition delivered to the plurality of device structures at a non-zero angle of inclination relative to a perpendicular extending from an upper surface of the base, and forming a fill material within one or more trenches defined by the plurality of device structures.

In some embodiments, a method of forming a semiconductor device, may include providing a plurality of device structures extending vertically from a base, each of the plurality of device structures including a first sidewall opposite a second sidewall and a top surface extending between the first and second sidewalls, and providing a seed layer over the first sidewall, the second sidewall, and the top surface. The method may further include forming a dielectric layer along just the top surface and along an upper portion of the first and second sidewalls using an angled dielectric material deposition delivered to the plurality of device structures at a non-zero angle of inclination relative to a perpendicular extending from an upper surface of the base, and depositing a fill material within one or more trenches defined by the plurality of device structures, wherein the fill material is inhibited from being formed along the dielectric layer.

In some embodiments, a method may include providing a semiconductor device including a plurality of device structures extending vertically from a base, each of the plurality of device structures including a first sidewall opposite a second sidewall and a top surface extending between the first and second sidewalls, and providing a seed layer over the plurality of device structures. The method may further include forming a dielectric layer along just the top surface and along an upper portion of the first and second sidewalls using an angled deposition delivered to the plurality of device structures at a non-zero angle of inclination relative to a perpendicular extending from an upper surface of the base, and depositing a fill material over a portion of the seed layer extending between adjacent device structures of the plurality of device structures.

BRIEF DESCRIPTION OF THE DRAWINGS

The accompanying drawings illustrate exemplary approaches of the disclosure, including the practical application of the principles thereof, as follows.

Figure 1A:
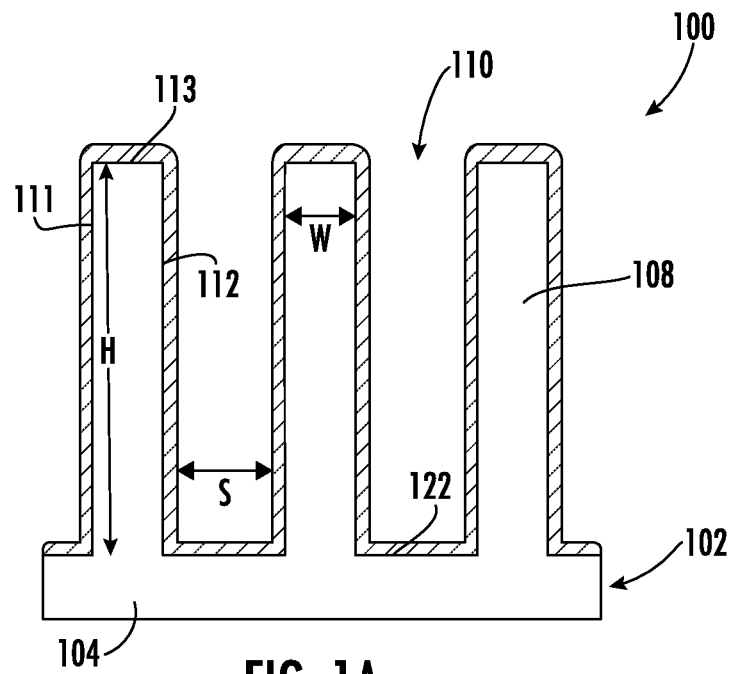
FIG. 1A illustrates a side cross-sectional view of an exemplary device structure with a seed layer, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Apparatuses, systems, and methods in accordance with the present disclosure will now be described more fully hereinafter with reference to the accompanying drawings, where various embodiments are shown. The apparatuses, systems, methods may be embodied in many different forms and are not to be construed as being limited to the embodiments set forth herein. Instead, these embodiments are provided so the disclosure will be thorough and complete, and will fully convey the scope of the apparatuses, systems, and methods to those skilled in the art.

The present embodiments provide novel techniques and substrate structures to form devices, such as electronic devices, where selective formation of a layer on a three-dimensional surface is an integral part of device fabrication. In particular examples, a dielectric material is selectively formed on a portion of a device having a three-dimensional surface.

More specifically, embodiments of the present disclosure include a void-free material deposition (VFMD) process including directional deposition of a dielectric over sidewalls of a device structure (e.g., finned substrate or contact vias) followed by deposition of a fill material. In exemplary embodiments, the process may start with a conformally deposited metal seed layer over the device structure. Next, the top of the fin(s) of the device structure may be covered with a dielectric layer (e.g., thin film of SiN or SiOx or a-Si) using a directional ribbon beam plasma-enhanced chemical vapor deposition (PECVD) process. A fill material (e.g., bulk metal) may then be deposited over the device structure, including within trenches formed between each of the plurality of fins of the device structure, using an atomic layer deposition or chemical vapor deposition process. Covering the top and sides of the fin(s) with the dielectric layer advantageously inhibits nucleation and growth of the bulk metal fill material because the bulk ALD or CVD process is selective and chemistry dependent. The fill material will therefore grow bottom-up within the trenches leaving no seams or voids.

According to some embodiments, the techniques disclosed herein may be applicable to form memory devices, such as DRAM devices, while other devices may also be formed according to various embodiments of the disclosure. These other devices may include SRAM devices, NAND devices, including 3DNAND devices, NOR devices, X point memories and logic devices, as well as packaging structures, where a common feature is the linking of different components in different levels of a given device using a staggered structure, such as a staggered contact.

FIG. 1A illustrates a semiconductor structure/device (hereinafter "device") 100 according to embodiments of the present disclosure. As shown, the device 100 may be a substrate 102 including a base 104 and a plurality of device structures (e.g., fins) 108 extending vertically therefrom. Each device structure 108 may be separated from an adjacent device structure 108 by a trench 110. Furthermore, each device structure 108 may include a first sidewall 111 opposite a second sidewall 112, and a top surface 113 extending between the first and second sidewalls 111, 112. The first and second sidewalls 111, 112 may be parallel to one another, as shown, or non-parallel to one another in other embodiments.

Notably, the surface features 108 are characterized by a height H, a width W, and a spacing S. In some non-limiting embodiments, these dimensions may be uniform across a device or substrate, while in other embodiments, the height, width, and spacing may vary. Notably, while just three surface features are shown, these features may represent a large number of features in various embodiments, having individual dimensions on the order of micrometers, or nanometers, and arranged in arrays having the lateral dimensions on the order of millimeters and centimeters.

In some embodiments, the base 104 may be the same material as the material of the device structures 108, while in other embodiments, the base 104 may differ from the material of the device structures 108. For example, the base 104 may be a silicon layer, while the device structures 108 are silicon fins forming part of a fin-type field effect transistor (finFET). In some examples, the base 104 may be an oxide, nitride, semiconductor, or metal, while the device structures 108 are a different material than the base layer, including an oxide, nitride, semiconductor, or metal. Embodiments herein are not limited in this context.

As shown, a seed layer 120 may be formed over the device 100, including over the first sidewall 111, the second sidewall 112, the top surface 113, and along an upper surface 122 of the base 104 of the substrate 102. In some embodiments, the seed layer 120 may be a metal seed film, such as TiN or fluorine free Tungsten (W), deposited via an ALD or CVD processes.

Figure 1B:
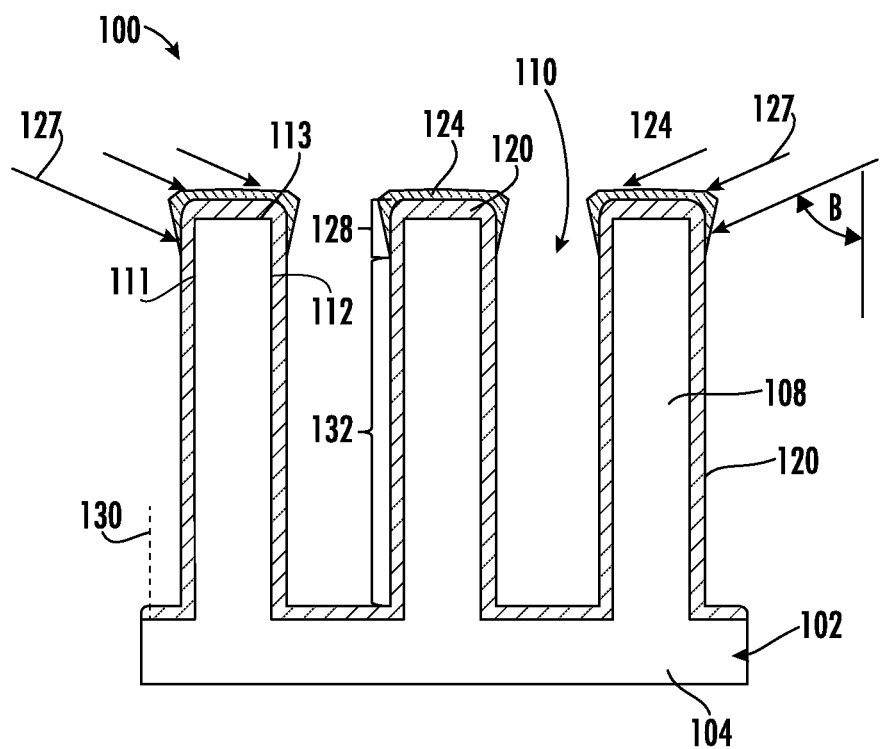
FIG. 1B illustrates a side cross-sectional view of the device structure during angled deposition of a dielectric layer, according to embodiments of the present disclosure.

As shown in FIG. 1B, a dielectric layer 124 may then be selectively formed over the device. Specifically, the dielectric layer 124 may be deposited over just the top surface 113 and along an upper portion 128 of the first and second sidewalls 111, 112. In some embodiments, the dielectric layer 124 is formed using an angled deposition 127 delivered to the plurality of device structures 108 at a non-zero angle of inclination β relative to a perpendicular 130 extending from the upper surface 122 of the base 104. In some embodiments, the dielectric layer 124 may be a dielectric thin film (e.g., SiN or SiOx or a-Si) deposited using a PECVD process. The non-zero angle of inclination β may be selected to ensure the angled deposition 127 does not impact a lower portion 132 of the first and second sidewalls 111, 112 of the device structures 108. The angled deposition 127 may be symmetric or asymmetric, the latter being beneficial to mitigate geometric limitations imposed by complicated DRAM structures.

The presence of the dielectric layer 124 will inhibit nucleation and growth of a bulk metal fill subsequently deposited within the trenches 110 since the bulk metal fill ALD or CVD process is selective and chemistry dependent. The bulk metal fill will grow bottom-up leaving no seams or voids in the bulk metal fill material. Furthermore, the angled deposition 127 of the dielectric layer 124 prevents growth of metal films in the upper portion of the trenches 110, essentially reducing the aspect ratio to make the metal film easier to grow seamlessly in the lower portion of the trenches 110.

Figure 1C:
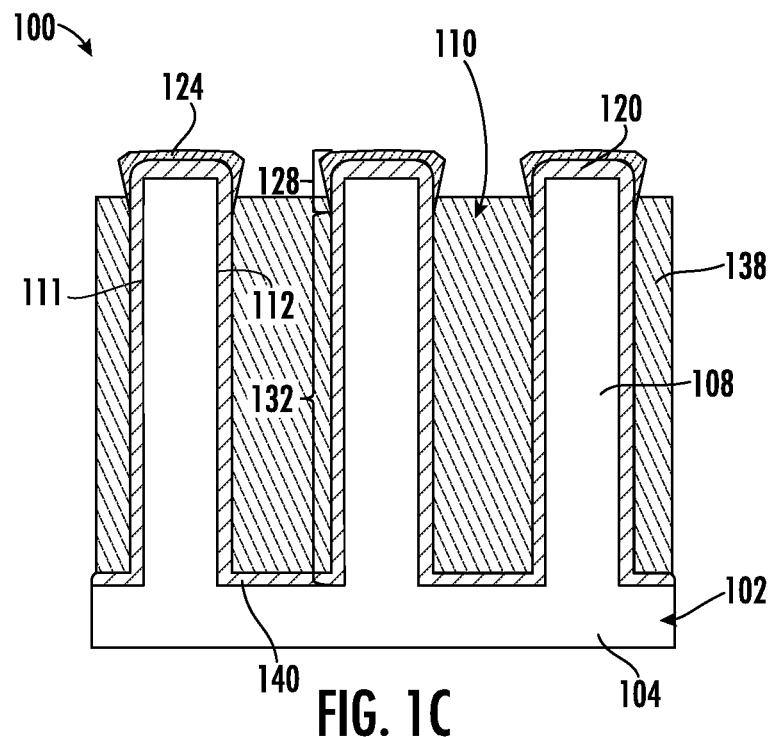
FIG. 1C illustrates a side cross-sectional view of the device structure following deposition of a fill material, according to embodiments of the present disclosure.

As shown in FIG. 1C, a fill material 138 (e.g., bulk metal fill) may be deposited within the trenches 110 of the device 100. The fill material 138 may be formed directly atop the seed layer 120 including over a portion 140 of the seed layer 120 at a bottom of each trench 110. As demonstrated, the fill material 138 may be formed primarily along the lower portion 132 of the first and second sidewalls 111, 112. The fill material 138 is inhibited by the dielectric layer 124 from growing along the upper portion 128 of the seed layer 120 on the first and second sidewalls 111, 112. In various embodiments, the fill material 138 is advantageously formed within each trench 110 without any voids, gaps, seams, etc. In various such embodiments, the fill material 138 may comprise a bottom-up fill, which grows or builds up from the portion 140 of the seed layer 120 at the bottom of the trenches 110. In other words, the fill material 138 advantageously grows seamlessly up from the seed layer 120 during the deposition process. Oftentimes the fill material 138 may be a conductive material, such as metal or a metal alloy. In some embodiments, the fill material 138 may be deposited over the device 100 including into the trenches 110, via ALD or CVD, resulting in bulk ALD or CVD growth. In yet other embodiments, the fill material 138 may be formed via electrodeposition.

Figure 1D:
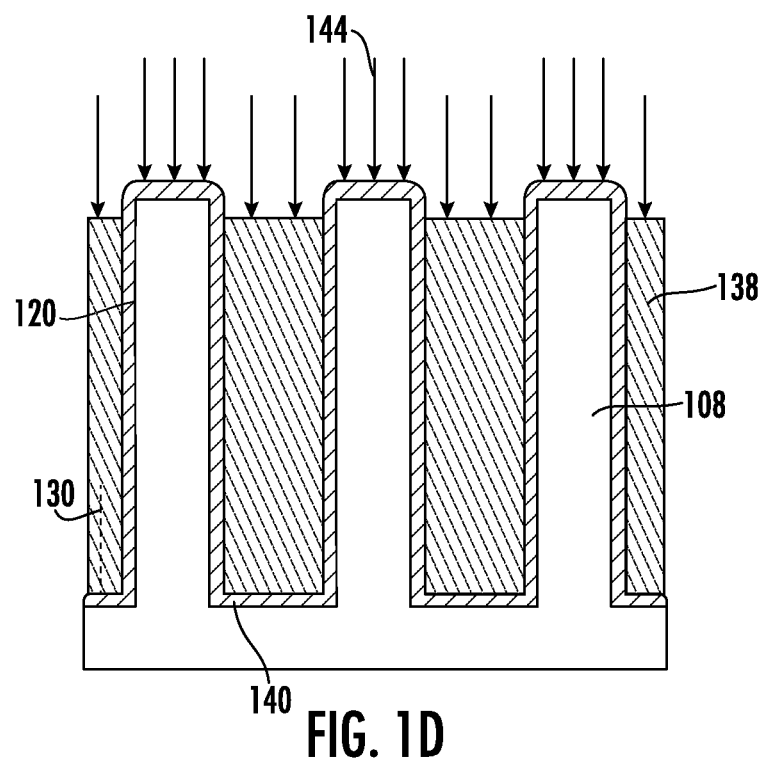
FIG. 1D illustrates a side cross-sectional view of the device structure during an etch process to remove the dielectric layer, according to embodiments of the present disclosure.

Next, as shown in FIG. 1D, the dielectric layer 124 may be removed by an etch process 144. The etch process 144 may be selective to the seed layer 120. In various embodiments, the etch process 144 may be a vertical etch, as shown, or performed at a non-zero angle of inclination relative to the perpendicular 130.

Figure 1E:
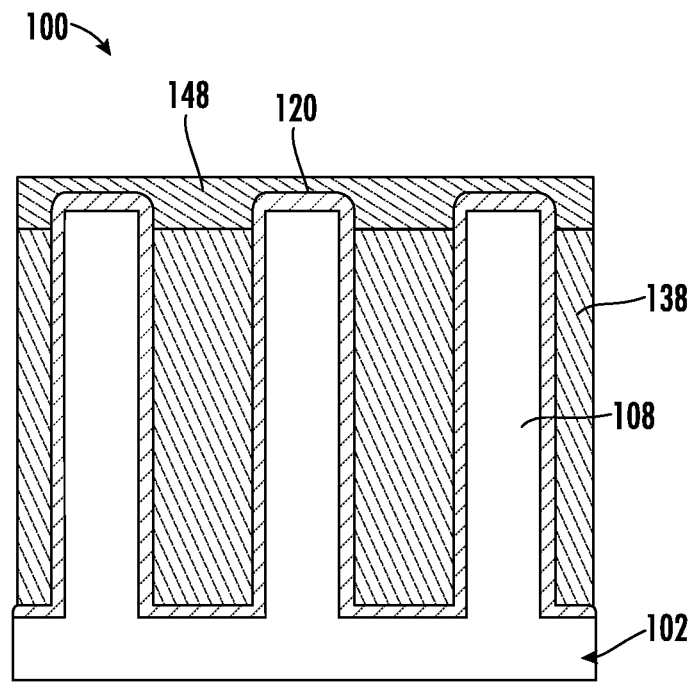
FIG. 1E illustrates a side cross-sectional view of the device structure following deposition of a second fill material, according to embodiments of the present disclosure.

As shown in FIG. 1E, a second fill material 148 may then be deposited over the device 100, including over the fill material 138 and over the exposed portions of the seed layer 120. Although non-limiting, the second fill material 148 may be a conductive material, such as metal or a metal alloy. In some embodiments, the second fill material 148 may be deposited over the device 100 via ALD or CVD, resulting in bulk ALD or CVD growth. In yet other embodiments, the second fill material 148 may be formed via electrodeposition. The second fill material 148 and the fill material 138 may be the same or different materials.

Figure 1F:
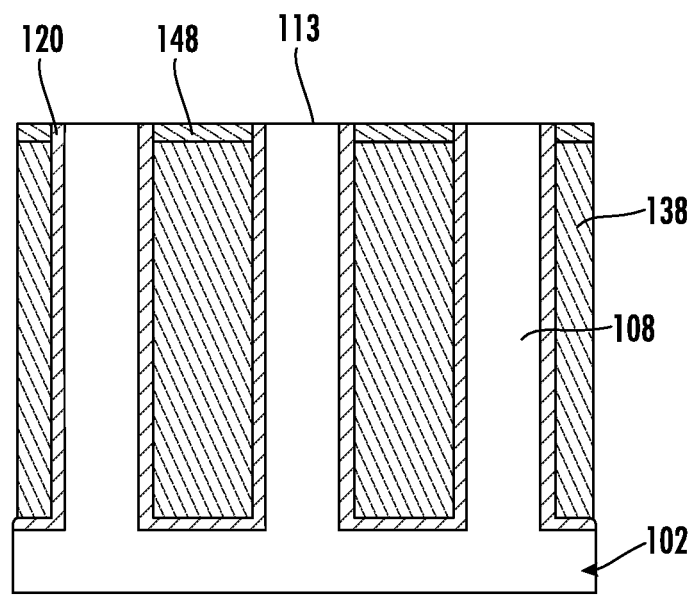
FIG. 1F illustrates a side cross-sectional view of the device structure following a planarization, according to embodiments of the present disclosure.

The device 100 may then be planarized, as shown in FIG. 1F. As shown, a portion of the second fill material 148 may be removed/recessed, and the seed layer 120 removed from the top surface 113 of the device structures 108. In some embodiments, the planarization may be a chemical-mechanical planarization (CMP), which is selective to the top surface 113 of the device structures 108.

Figure 2A:
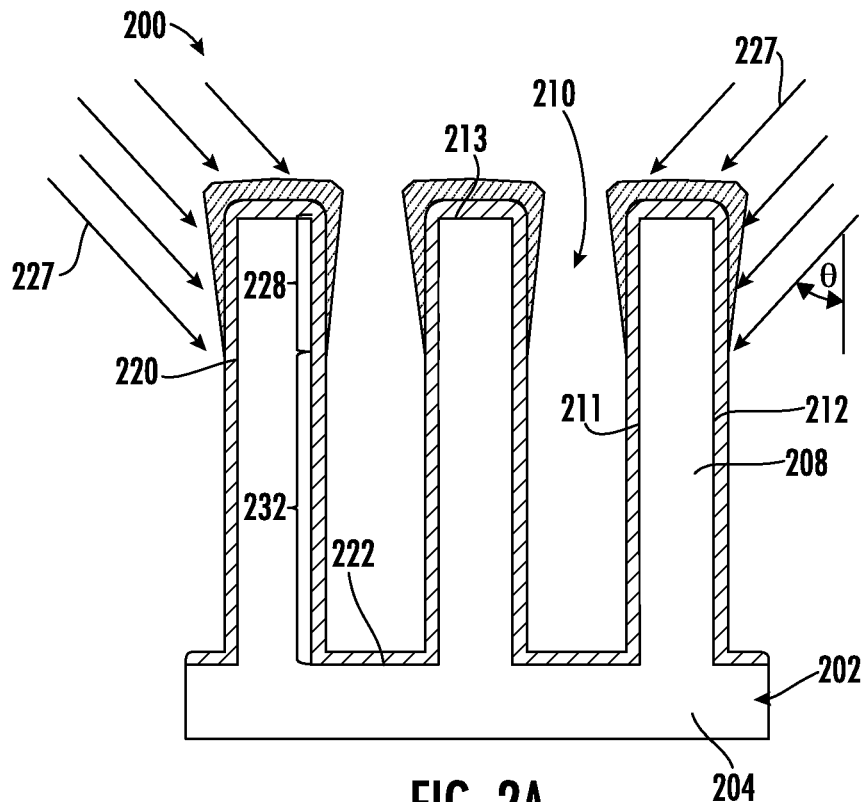
FIG. 2A illustrates a side cross-sectional view of a device structure during angled deposition of a dielectric layer, according to embodiments of the present disclosure.

Turning now to FIG. 2A, formation of a device 200 according to another embodiment of the present disclosure will be described. The device 200 may share many of the same features or aspects of the device 100 described above. As such, only certain aspects of the device 200 may hereinafter be described for the sake of brevity. As shown, the device 200 may include a substrate 202 including a base 204 and a plurality of device structures (e.g., fins) 208 extending vertically therefrom. Each device component 208 may be separated from an adjacent device component 208 by a trench 210. Furthermore, each device component 208 may include a first sidewall 211 opposite a second sidewall 212, and a top surface 213 extending between the first and second sidewalls 211, 212.

As shown, a seed layer 220 may be formed over the device 200, including over the first sidewall 211, the second sidewall 212, the top surface 213, and along an upper surface 222 of the base 204 of the substrate 202. In some embodiments, the seed layer 220 may be a metal seed film, such as TiN or fluorine free Tungsten (W), deposited via an ALD or CVD processes.

A dielectric layer 224 may then be formed over just the top surface 213 and along an upper portion 228 of the first and second sidewalls 211, 212. In some embodiments, the dielectric layer 224 is formed using an angled deposition 227 delivered to the plurality of device structures 208 at a non-zero angle of inclination θ relative to a perpendicular 230 extending from the upper surface 222 of the base 204. In this non-limiting embodiment, the non-zero angle of inclination θ may be less than the non-zero angle of inclination β demonstrated in FIG. 1B. As a result, the angled deposition 227 may impact a greater amount of the first and second sidewalls 211, 212 as compared to the first and second sidewalls 111, 112 of the device 100, for example. The non-zero angle of inclination β and the non-zero angle of inclination θ are non-limiting and may be modified in various embodiments.

In some embodiments, the dielectric layer 224 may be a dielectric thin film (e.g., SiN or SiOx or a-Si) deposited using a PECVD process. The non-zero angle of inclination θ may be selected to ensure the angled deposition 227 does not impact a lower portion 232 of the first and second sidewalls 211, 212 of the device structures 208.

Figure 2B:
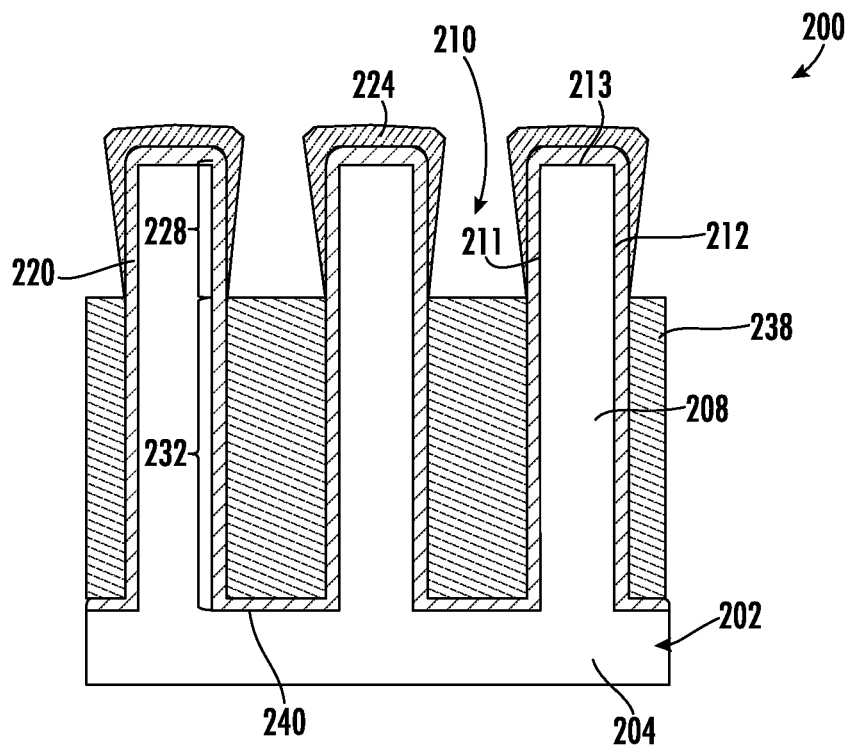
FIG. 2B illustrates a side cross-sectional view of the device structure following deposition of a fill material, according to embodiments of the present disclosure.

As shown in FIG. 2B, a fill material 238 (e.g., bulk metal fill) may be deposited within the trenches 210 of the device 200. The fill material 238 may be formed directly atop the seed layer 220 including over a portion 240 of the seed layer 220 at a bottom of each trench 210. As demonstrated, the fill material 238 may be formed just along the lower portion 232 of the seed layer 220 lining the first and second sidewalls 211, 212. The fill material 238 is inhibited by the dielectric layer 224 from growing along the upper portion 228 of the seed layer 220. In various embodiments, the fill material 238 is advantageously formed within each trench 210 without any voids, gaps, seams, etc. In various such embodiments, the fill material 238 may comprise a bottom-up fill, which grows or builds up from the portion 240 of the seed layer 220 at the bottom of the trenches 210. In other words, the fill material 238 advantageously grows seamlessly up from the seed layer 220 during the deposition process. The fill material 238 may be a conductive material, such as metal or a metal alloy. In some embodiments, the fill material 238 may be deposited over the device 200 including into the trenches 210, via ALD or CVD, resulting in bulk ALD or CVD growth. In yet other embodiments, the fill material 238 may be formed via electrodeposition.

Figure 2C:
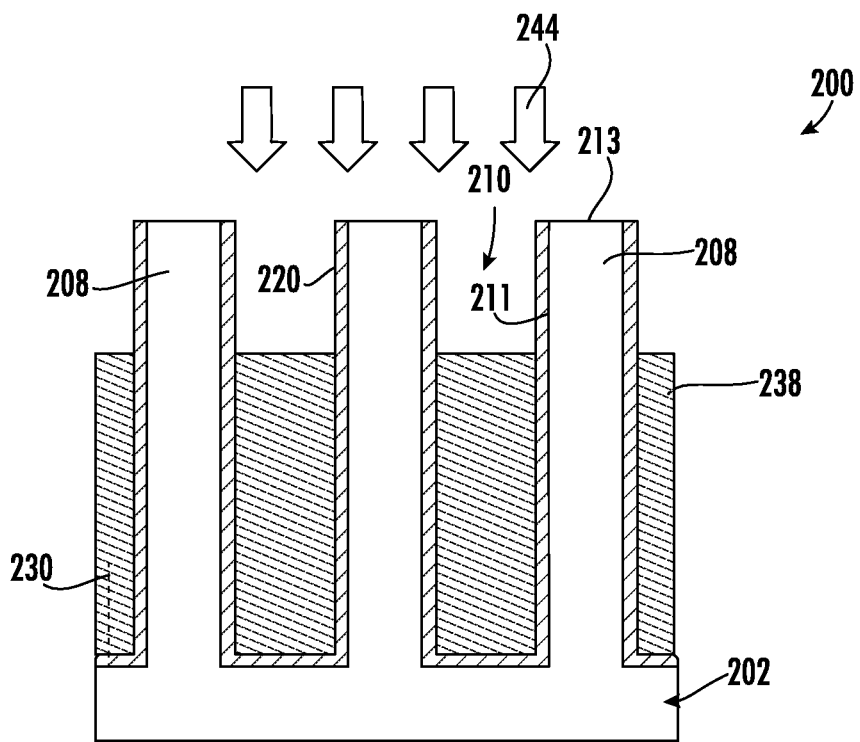
FIG. 2C illustrates a side cross-sectional view of the device structure following an etch process to remove the dielectric layer and a portion of a seed layer, according to embodiments of the present disclosure.

Next, as demonstrated in FIG. 2C, the dielectric layer 224 and the seed layer 220 may be removed from the top surface 213 of each device component 208 by an etch process 244. The etch process 244 may be selective to the silicon of the device components 208. In various embodiments, the etch process 244 may be a vertical etch, as shown, or performed at a non-zero angle of inclination relative to the perpendicular 230.

Figure 2D:
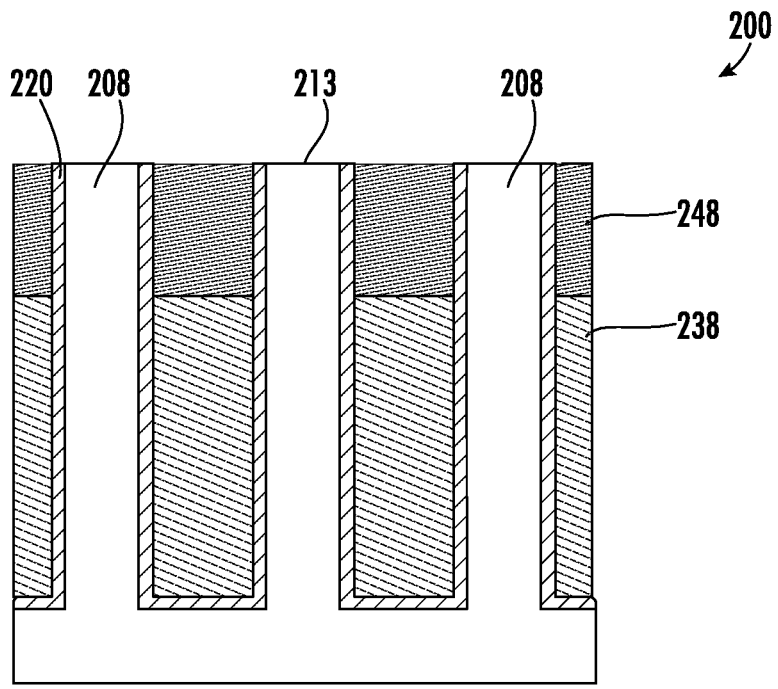
FIG. 2D illustrates a side cross-sectional view of the device structure following deposition of a second fill material, according to embodiments of the present disclosure.

As shown in FIG. 2D, a second fill material 248 may then be deposited over the device 200, including over the fill material 238 and over/along the exposed portions of the seed layer 220. Although non-limiting, the second fill material 248 may be a conductive material, such as metal or a metal alloy. In some embodiments, the second fill material 248 may be deposited over the device 200 via ALD or CVD, resulting in bulk ALD or CVD growth. In yet other embodiments, the second fill material 248 may be formed via electrodeposition. The second fill material 248 and the fill material 238 may be the same or different materials.

Figure 3A:
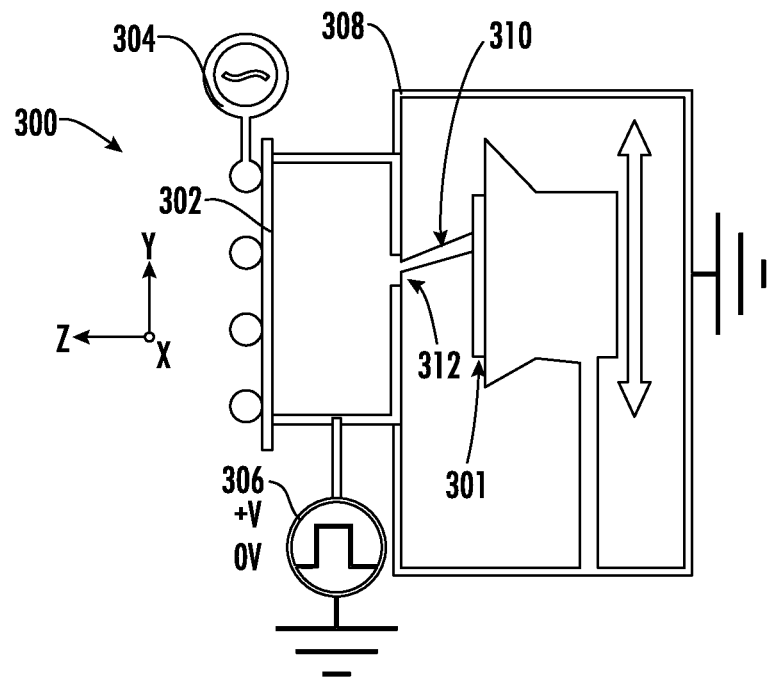
FIG. 3A shows a side view of an apparatus according to embodiments of the disclosure.

While the present embodiments cover any suitable ion source to provide an angled reactive beam for selectively forming a dielectric layer, such as dielectric layers 124 and 224, and/or a seed layer, such as seed layer 120 and seed layer 220, according to various embodiments of the disclosure a reactive beam may be formed from a compact plasma source. FIG. 3A shows a side view of an apparatus 300 according to embodiments of the disclosure. In this example, the apparatus 300 includes a plasma chamber 302, powered by a power source 304, which power source may be an RF source or other suitable power source. Various gas sources (not shown) may be employed to supply a suitable gas to generate a reactive beam of the appropriate composition. In some examples, reactive gases based upon fluorides/or chlorides of a metal layer to be deposited are used. For example, a tungsten hexafluoride gas may be provided to the plasma chamber 302 to generate a reactive beam that contains tungsten. Another example could be titanium tetrachloride may be used as a gas (together with ammonia or nitrogen gas) that is supplied to plasma chamber 302 to generate a reactive beam for TiN deposition of a seed layer. In still other examples, organometallics may be used for plasma enhanced ALD processes to generate a metallic seed layer.

When a plasma is generated in the plasma chamber 302, a reactive beam 310 may be extracted through an extraction aperture 312 that is arranged along one side of the plasma chamber 302, and the reactive beam 310 may be directed to the substrate 301. Various types of extraction assembly may be employed to extract the reactive beam 310, with examples shown in the figures to follow.

Generally, an extraction assembly will be designed to extract the reactive beam 310 at a non-zero angle of incidence with respect to a perpendicular to a plane of the substrate 301. The reactive beam 310 may include radicals, energetic radicals, and energetic neutrals that tend to stream out of the plasma chamber 302 in a directional manner that defines the non-zero angle of incidence. As well as neutral species, the reactive beam 310 may include reactive ions. In some embodiments, an extraction voltage supply 306 may be employed to apply a bias voltage between the plasma chamber 302 and the substrate 301, in order to impart a specific ion energy to ions of the reactive beam 310. For example, an extraction voltage of 300 eV applied between the plasma chamber 302 and the process chamber 308 that contains the substrate 301 (assuming that the substrate 301 is biased to the same potential as the process chamber 308) will generate a reactive beam 310 having ions characterized by an ion energy slightly in excess of 300 eV.

In some non-limiting embodiments, ions of the reactive beam 310 may be directed at an energy of 500 eV or less, 300 eV or less, or 100 eV or less. In some embodiments, the reactive beam 310 may include ions that are directed at an energy of 10 eV to 100 eV. Depending upon the exact ion species of reactive beam 310, an energy below or equal to 200 or 100 eV may help in increasing the flux of charged species to the substrate 201 which can enhance the nucleation rate of depositing material with minimal re-sputtering, leading to a controlled placement of the deposition materials such as 124 dielectric layers or metals, such as the dielectric layer 124 shown in FIG. 1B and the dielectric layer 224 shown in FIG. 2A. In some embodiments, no extraction voltage may be applied between the plasma chamber 302 and the process chamber 308. In such circumstances, when the plasma chamber 302 and the process chamber 308 are held at the same potential (e.g., ground potential), the reactive beam 310 will be extracted at an ion energy equal to the plasma potential in the plasma chamber 302, often in the range of 10 eV to 40 eV, depending upon the ion species, plasma density, and so forth. At ion energy in this range, any ions of the reactive beam 310 may be directed with sufficient collimation and sufficient energy to help deposit a selective seed layer or a selective dielectric layer, where resputtering is minimal or non-existent.

Figure 3B:
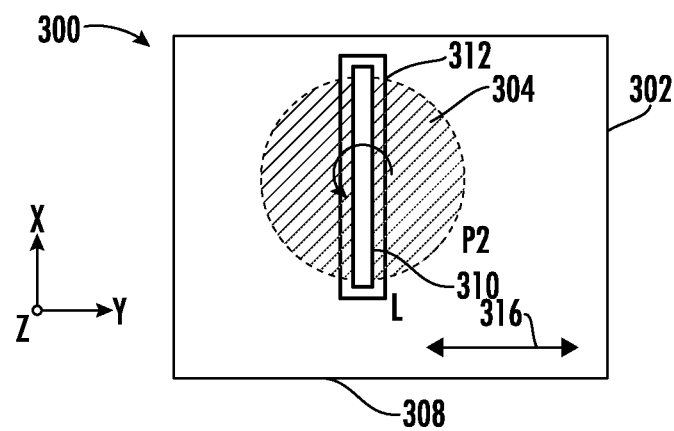
FIG. 3B shows a top plan view of a variant of the apparatus of FIG. 3A.

FIG. 3B shows a top plan view of a variant of the apparatus 300 of FIG. 3A. In this variant the extraction aperture is elongated along the x-direction, to generate a ribbon-shaped ion beam for reactive beam 310. This shape of an ion beam may cover an entirety of the substrate 301, such as a silicon wafer, along the x-direction, so that scanning 316 of the substrate 301 along the Y-direction may effectively expose the entirety of the substrate 301 to the reactive beam 310.

Figure 4:
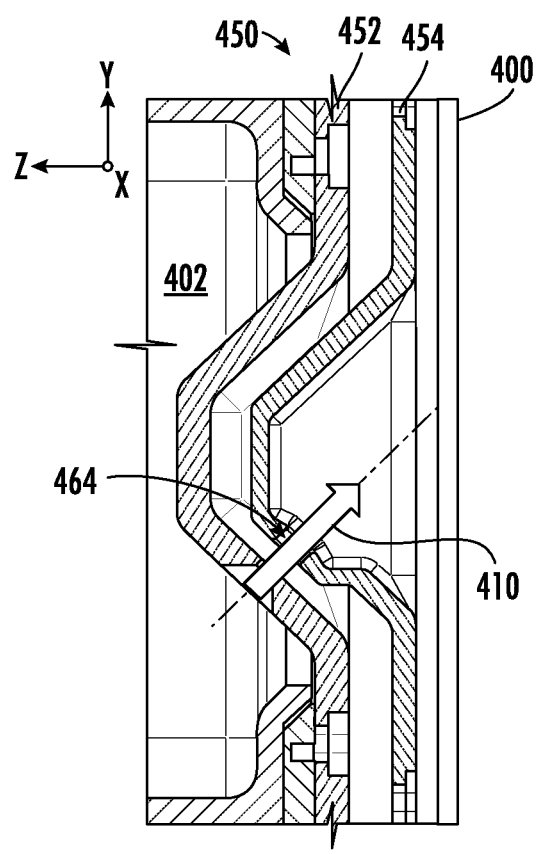
FIG. 4 shows a side view of another apparatus according to embodiments of the disclosure.

FIG. 4 shows a side view of another apparatus according to embodiments of the disclosure. The view in FIG. 4 shows a cross-section of an extraction assembly 450, coupled to the plasma chamber 402, and including a first extraction plate 452 and a second extraction plate 454. As shown, the first extraction plate 452 and a second extraction plate 454 are arranged to include an angled recess, where one edge of the angled recess includes an extraction aperture 464 that is angled with respect to the substrate 400 to extract an ion beam 410 at a fixed, non-zero angle of incidence with respect to a perpendicular to a plane of the substrate 400. Extraction of the ion beam 410 may proceed as discussed with respect to FIG. 3A, where a bias voltage may or may not be applied between the plasma chamber 402 and substrate 400, depending upon the targeted ion energy. Such a configuration may be suitable to deposit a selective dielectric and/or seed layer on the substrate 400 when the geometry of the substrate 400 features is uniform, for example. Thus, the extraction assembly 450 may be set to generate a 45-degree angle of incidence, a 30-degree angle of incidence, a 60-degree angle of incidence, and so forth.

Figure 5:
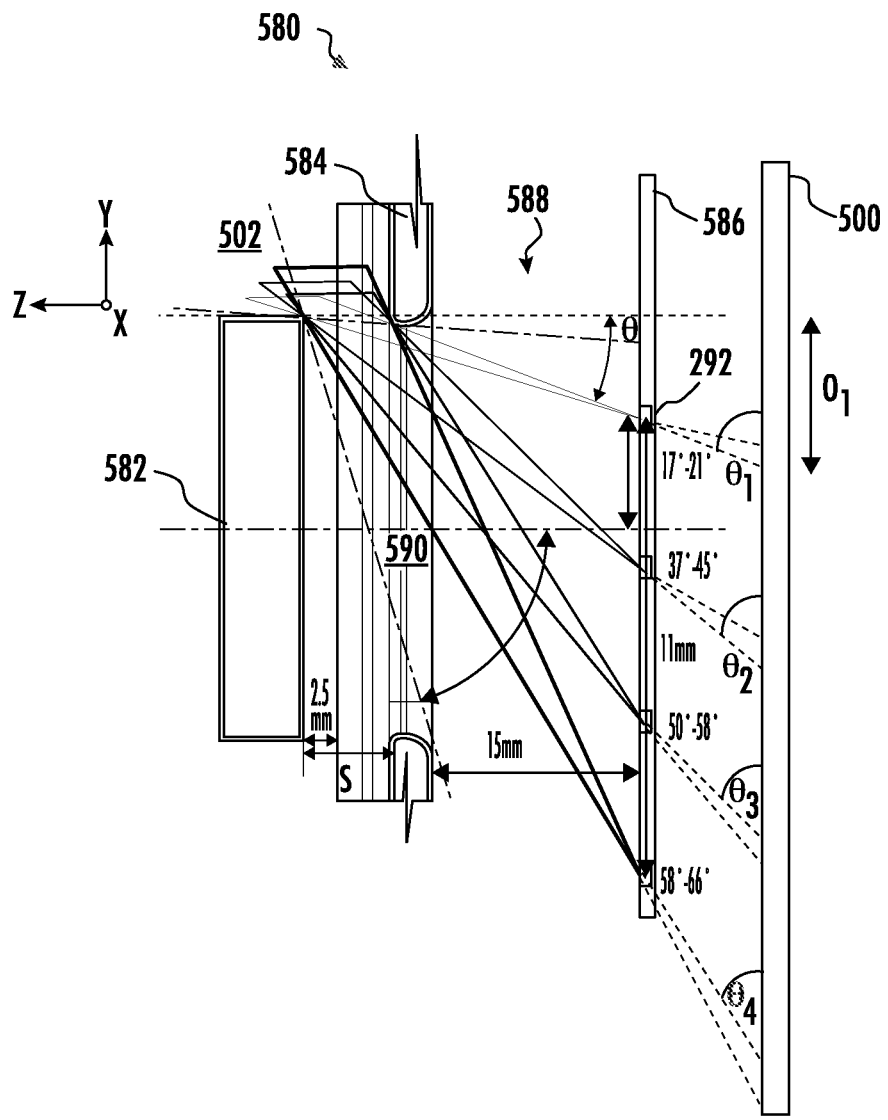
FIG. 5 shows a side view of a further apparatus according to embodiments of the disclosure.

FIG. 5 shows a side view of another apparatus according to embodiments of the disclosure. The view in FIG. 5 shows a cross-section of an extraction assembly 550, coupled to the plasma source chamber 502, and including an extraction plate 584 and a beam blocker 582. The extraction assembly 580 may further include a collimation plate 586, disposed between the extraction plate 584 and substrate 500. Extraction of an ion beam 588 may proceed as discussed with respect to FIG. 3A, where a bias voltage may or may not be applied between the plasma source chamber 502 and substrate 500, depending upon the targeted ion energy. To generate the angled ion beam 588, the beam blocker 582 may be arranged to block a portion of the aperture 590, formed with the extraction plate 584, so that an ion beam 588 is extracted from the plasma source chamber 502 along the edge of the aperture as shown.

Notably, ions may exit the plasma source chamber 502 over a range of angles. To select for a given angle of incidence (or narrow range of angles of incidence), the collimation plate 586 may be provided with one or more collimation apertures 592 arranged at a specific offset O with respect to an edge of the aperture 590. FIG. 5 illustrates four possible placements for the collimation aperture 592. Increasing the value of O will lead to a higher value of θ. For example, for an offset $O_1$, the corresponding $θ_1$ is 17-21 degrees. Larger offsets will produce larger angles of incidence. Thus, for a given placement of the collimation aperture 592, ions exiting the plasma source chamber 502 will be blocked from traversing to the substrate 500, except those ions having the suitable angle of incidence to pass through the collimation aperture 592 and strike the substrate 500. Thus, by switching between different collimation plates having different value of O, the apparatus of FIG. 5 presents a convenient means to vary the angle of incidence of ions of a reactive beam to be applied to a substrate to change the coverage of a selective dielectric and/or seed layer on device components of the substrate 500, such as device structures 108 and 208 described above.

In sum, by utilizing the embodiments described herein, void-free material depositions can be formed. A first technical advantage of the void-free trench-fills (or VFTF components) of the present embodiments includes increasing the available volume of fill materials in a trench. For example, increasing the available volume of metal fill materials in a trench improves conductivity. A second technical advantage of the VFTFs of the present embodiments includes improved manufacturing efficiency by reducing or eliminating time consuming and difficult processes including surface poisoning, lithography, etching, and CMP. For example, process flows that involve poisoning surfaces (for e.g., ammonia or remote plasma inhibition) to selectively inhibit top-surface growth to avoid pinch-off can be avoided. Further, a third technical advantage of the VFTFs of the present embodiments includes contact/plug uniformity, such by avoiding a top V-groove even in wide-pitch trench-fills. A fourth technical advantage of the VFTFs of the present embodiments includes critical dimension dependent directional etching that allows etching to required angles and/or depths as needed in conjunction with selective growth to obtain void-free material depositions.

In various embodiments, design tools can be provided and configured to create the datasets used to produce the void-free trench-fills described herein. For example, data sets can be created to directionally etch a seed layer from predetermined portion of a trench and/or fin as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the description, the various features and functionality described herein may be implemented in any given application. Furthermore, the various features and functionality can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
providing a plurality of device structures extending from a base, each of the plurality of device structures including a first sidewall opposite a second sidewall and a top surface extending between the first and second sidewalls;
providing a seed layer over the plurality of device structures;
forming a dielectric layer along just the top surface and along an upper portion of the first and second sidewalls using an angled deposition delivered to the plurality of device structures at a non-zero angle of inclination relative to a perpendicular extending from an upper surface of the base; and
forming a fill material within one or more trenches defined by the plurality of device structures.

2. The method of claim 1, further comprising forming the fill material using a bulk atomic layer deposition process or a bulk chemical vapor deposition process.

3. The method of claim 1, wherein the fill material is formed just along a lower portion of the first and second sidewalls.

4. The method of claim 1, wherein the fill material is not formed over the dielectric layer.

5. The method of claim 1, wherein forming the dielectric layer comprises depositing a dielectric material using a plasma enhanced chemical vapor deposition process.

6. The method of claim 1, further comprising etching the plurality of device structures to remove the dielectric layer from the top surface of each of the plurality of device structures.

7. The method of claim 1, further comprising depositing a second fill material over the fill material.

8. The method of claim 7, further comprising planarizing the second fill material and the plurality of device structures to remove the seed layer from the top surface of each of the plurality of device structures.

9. The method of claim 1, further comprising:
etching the plurality of device structures to remove the dielectric layer and the seed layer from the top surface of each of the plurality of device structures; and
forming a second fill material over the fill material.

10. A method of forming a semiconductor device, comprising:
providing a plurality of device structures extending vertically from a base, each of the plurality of device structures including a first sidewall opposite a second sidewall and a top surface extending between the first and second sidewalls;
providing a seed layer over the first sidewall, the second sidewall, and the top surface;
forming a dielectric layer along just the top surface and along an upper portion of the first and second sidewalls using an angled dielectric material deposition delivered to the plurality of device structures at a non-zero angle of inclination relative to a perpendicular extending from an upper surface of the base; and
depositing a fill material within one or more trenches defined by the plurality of device structures, wherein the fill material is inhibited from being formed along the dielectric layer.

11. The method of claim 10, further comprising depositing the fill material using a bulk atomic layer deposition process or a bulk chemical vapor deposition process.

12. The method of claim 10, wherein the fill material is formed just along a lower portion of the first and second sidewalls.

13. The method of claim 10, further comprising forming the dielectric layer using a plasma enhanced chemical vapor deposition process.

14. The method of claim 10, further comprising:
etching the plurality of device structures to remove the dielectric layer from the top surface of each of the plurality of device structures;
depositing a second fill material over the fill material; and
planarizing the second fill material and the plurality of device structures to remove the seed layer from the top surface of each of the plurality of device structures.

15. The method of claim 10, further comprising:
etching the plurality of device structures to remove the dielectric layer and the seed layer from the top surface of each of the plurality of device structures; and
forming a second fill material over the fill material.

16. A method, comprising:
providing a semiconductor device including a plurality of device structures extending vertically from a base, each of the plurality of device structures including a first sidewall opposite a second sidewall and a top surface extending between the first and second sidewalls;
providing a seed layer over the plurality of device structures;
forming a dielectric layer along just the top surface and along an upper portion of the first and second sidewalls using an angled deposition delivered to the plurality of device structures at a non-zero angle of inclination relative to a perpendicular extending from an upper surface of the base; and
depositing a fill material over a portion of the seed layer extending between adjacent device structures of the plurality of device structures.

17. The method of claim 16, further comprising depositing the fill material using a bulk atomic layer deposition process or a bulk chemical vapor deposition process, wherein the fill material is inhibited from forming along the dielectric layer.

18. The method of claim 16, wherein the fill material is formed along just a lower portion of the first and second sidewalls.

19. The method of claim 16, further comprising:
etching the semiconductor device to remove the dielectric layer from the top surface of each of the plurality of device structures;
depositing a second fill material over the fill material; and
planarizing the second fill material and the plurality of device structures to remove the seed layer from the top surface of each of the plurality of device structures.

20. The method of claim 16, further comprising:
etching the plurality of device structures to remove the dielectric layer and the seed layer from the top surface of each of the plurality of device structures; and
forming a second fill material over the fill material.

* * * * *